(12) United States Patent
Miwa

(10) Patent No.: US 6,493,066 B1
(45) Date of Patent: *Dec. 10, 2002

(54) EXPOSURE APPARATUS

(75) Inventor: Yoshinori Miwa, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/255,338

(22) Filed: Feb. 23, 1999

(30) Foreign Application Priority Data

Feb. 24, 1998 (JP) .......................... 10-057378

(51) Int. Cl.⁷ ............................................. G03B 27/54
(52) U.S. Cl. ..................................................... 355/67
(58) Field of Search ........................... 355/67, 69, 68, 355/77, 53; 430/30; 347/246

(56) References Cited

U.S. PATENT DOCUMENTS

| | | | |
|---|---|---|---|
| 5,447,596 A | | 9/1995 | Hayase ........................ 156/584 |
| 5,473,412 A | * | 12/1995 | Ozawa ........................ 355/77 |
| 5,534,970 A | * | 7/1996 | Nakashima et al. .......... 355/53 |
| 5,627,627 A | * | 5/1997 | Suzuki ........................ 355/68 |
| 5,728,495 A | * | 3/1998 | Ozawa ........................ 430/30 |
| 5,783,022 A | | 7/1998 | Cha et al. .................... 156/344 |
| 5,831,715 A | * | 11/1998 | Takahashi .................... 355/53 |
| 5,877,843 A | * | 3/1999 | Takagi et al. ................. 355/30 |
| 6,219,083 B1 | * | 4/2001 | Dhurjaty et al. ............. 347/246 |

FOREIGN PATENT DOCUMENTS

| | | |
|---|---|---|
| EP | 0 383 391 A1 | 2/1990 |
| EP | 0 867 917 A2 | 3/1998 |
| EP | 0 866 300 A2 | 6/1998 |
| EP | 0 886 300 | 6/1998 |
| JP | 7-254559 | 10/1995 |

OTHER PUBLICATIONS

Patent Abstract of Japan, Publication No. 09167724 published on Jun. 24, 1997 for application No. 08282601 filed on Oct. 24, 1996.

* cited by examiner

Primary Examiner—N. Le
Assistant Examiner—Etienne P LeRoux
(74) Attorney, Agent, or Firm—Fitzpatrick, Cella, Harper & Scinto

(57) ABSTRACT

In order to perform integrated exposure control with high precision even if the wavelength of a light source is changed, an exposure apparatus includes an exposure optical system, an exposure amount control unit, a wavelength changing unit, and a correction unit. The exposure optical system has a laser as a light source to irradiate a photosensitive substrate with light from the light source. The exposure amount control unit controls an exposure amount for the photosensitive substrate. The wavelength changing unit changes an oscillation wavelength of the laser to a predetermined wavelength. The correction unit corrects a target exposure amount to irradiate the photosensitive substrate in accordance with the oscillation wavelength of the laser.

9 Claims, 7 Drawing Sheets

EXPOSURE APPARATUS

BACKGROUND OF THE INVENTION

1. Field of the Invention

The present invention relates to an exposure apparatus for transferring a circuit pattern drawn on a mask onto a substrate coated with a photosensitive agent and, more particularly, to an exposure apparatus which uses a laser as a light source and with which good exposure amount control is possible when the oscillation wavelength of the laser source is to be changed.

2. Description of the Related Art

Conventionally, in the process of manufacturing a semiconductor element, e.g., an LSI or a VLSI, which is formed of a very fine pattern, a reduction projection exposure apparatus for reducing and projecting a circuit pattern drawn on a mask onto a substrate coated with a photosensitive agent and printing it is used. As the integration density of the semiconductor elements increases, a finer pattern is required. Along with a progress in the resist process, the exposure apparatus must cope with a finer pattern.

As a means for improving the resolving power of the exposure apparatus, a method of changing the exposure wavelength to a shorter one and a method of increasing the numerical aperture (NA) of the projection optical system are available. It is generally known that a resolving power is proportional to the exposure wavelength and inversely proportional to the NA. Attempts have been made to keep the depth of focus of the projection optical system while improving the resolving power. Generally, the depth of focus is proportional to the exposure wavelength and decreases to be in an inverse proportion to the square of the NA, and to improve the resolving power and to keep the depth of focus are contradictory issues. In order to solve this problem, the phase shift reticle method, the FLEX (Focus Latitude Enhancement Exposure) method, and the like are proposed.

Regarding the exposure wavelength, a KrF excimer laser having an oscillation wavelength near 248 nm has become the mainstream recently to replace a 365-nm i-line. As the next-generation exposure light source, an ArF excimer laser having an oscillation wavelength near 193 nm is under development.

From the viewpoint of the manufacturing cost of the semiconductor element, a further increase in throughput in the exposure apparatus has been made. For example, a method of shortening the exposure time per shot by increasing the output from the exposure light source, a method of increasing the number of elements per shot by increasing the exposure area, and the like are proposed as the attempts aiming at this increase in throughput.

In recent years, in order to cope with an increase in chip size of the semiconductor element, a step-and-repeat type, so-called stepper, which sequentially prints the mask patterns and moves them in the step manner is shifting to a step-and-scan type exposure apparatus which performs scanning and exposure while keeping the mask and wafer in the synchronized state and sequentially moves them to the following shot. This step-and-scan type exposure apparatus has a slit-like exposure field and can accordingly increase the exposure area without increasing the size of the projection optical system.

As the resolving power increases by increasing the NA of the projection optical system and decreasing the wavelength of the light source described above, an exposure amount must be given to the photosensitive material (photoresist) applied to the wafer at high precision, and an increase in precision in exposure amount control has been made.

FIG. 5 is a conceptual view of an exposure apparatus for exposing a circuit pattern image onto a wafer. Referring to FIG. 5, a beam emitted by an excimer laser 1 is shaped into a predetermined beam shape through a beam shaping optical system 2 and becomes incident on an optical integrator 3 formed by two-dimensionally aligning a plurality of small lenses. The optical integrator 3 forms a secondary source near its exit surface 3a. A light beam from the secondary source is focused by a first focusing lens 4. A blind (not shown) for regulating the illumination range is arranged near a plane perpendicularly intersecting an optical axis including a focal point 6 of the first focusing lens 4. A light beam from the first focusing lens 4 uniformly illuminates the pattern surface of a mask 8 through a second focusing lens 7. The pattern of the mask 8 is reduced and projected by a projection optical system 9 to a wafer 10 coated with a photosensitive material. A half mirror 5 is placed between the first focusing lens 4 and focal point 6 to branch part of the light. The photoelectric conversion surface of a sensor 11 is placed near a focal point 6a of the branched light. Hence, the surface of the wafer 10, the pattern surface of the mask 8, and the plane perpendicularly intersecting the optical axis including the focal point 6 are conjugate, and accordingly, the sensor 11 detects the illuminance at a position equivalent to the pattern surface of the mask 8.

A signal from the sensor 11 is amplified by an amplifier 12 and connected to an integrated exposure amount control unit 13 including a CPU (not shown). The integrated exposure amount control unit 13 is connected to the excimer laser 1 to control oscillation of the laser on the basis of the signal from the sensor 11.

Exposure amount control in the step-and-repeat method in the above arrangement will be described with reference to FIG. 6.

FIG. 6 is a flow chart of exposure amount control done by the CPU (not shown) included in the integrated exposure amount control unit 13. When exposure is started for a certain shot, in step 100, an emission pulse count m is set to 0 and a remaining exposure amount Ja(m−1) is set to an initial value (target exposure amount Ja). In step 101, the target exposure amount Ja is divided by a standard exposure amount Js per pulse to calculate a total number P of pulses required for exposure. A remainder L of this division is a theoretical number of insufficient pulses (0≦L<1) obtained when exposure is performed under the above conditions.

In step 102, the target exposure amount Ja is divided by the total number P of pulses to calculate a preset energy Je of the first pulse. Theoretically, when exposure is performed with this preset energy Je for the number P of pulses, the target exposure amount Ja is obtained.

In step 103, the preset energy Je for one pulse is set for the excimer laser (excimer laser 1 in FIG. 5) through the integrated exposure amount control unit (integrated exposure amount control unit 13 in FIG. 5). In step 104, a 1-pulse emission instruction is made through the integrated exposure amount control unit (integrated exposure amount control unit 13 in FIG. 5).

In step 105, the emission count of the excimer laser (excimer laser 1 in FIG. 5) is incremented. In step 106, an energy Jt per pulse is detected through the sensor (sensor 11 in FIG. 5) and the amplifier (amplifier 12 in FIG. 5).

In step 107, a current remaining exposure amount Jam is calculated from the previous remaining exposure amount Ja(m−1) and the current energy Jt per pulse.

In step 108, the preset energy Je for the next pulse is calculated from the remaining exposure amount Jam, the total number P of pulses, and the emission pulse count m from the start of exposure.

In step 109, the total number P of pulses required for exposure and the emission pulse count m from the start of exposure are compared. If P=m, the flow advances to exposure at the next shot position; if p>m, the flow returns to step 103.

In this manner, the steps 103 to 108 are repeated until the emission pulse count m reaches the total number P of pulses.

Regarding exposure amount control of the step-and-scan method, for example, as shown in Japanese Patent Laid-Open No. 7-254559, a method is proposed by the present applicant, in which exposure amount control is performed by adjusting the light amount of a pulse beam to irradiate next in accordance with the integrated light amount of the plurality of pulse beams irradiated already, so that the average of the light amounts of a predetermined number of consecutive pulse beams coincides with the target value. In this method, although the flow chart of the exposure amount control is different from that of FIG. 6 described above, its basic method of calculating the energy of the next pulse on the basis of the measurement value of the sensor 11 shown in FIG. 5 is the same as that of FIG. 6.

When ultraviolet radiation is used as the exposure light source, as described above, after the apparatus is used over a long period of time, ammonium sulfate $((NH_4)_2SO_4)$, silicon dioxide $(SiO_2)$, and the like attach to the surface of the optical element placed in the optical path to considerably degrade the optical characteristics. These materials are generated when ammonia $(NH_3)$, sulfurous acid $(SO_2)$, an Si compound, and the like contained in the ambient environment cause a chemical reaction upon being irradiated with the ultraviolet rays. Conventionally, in order to prevent this degradation in the optical element, the entire optical path is purged with clean dry air or an inert gas such as nitrogen.

Furthermore, it is known that, in the ArF excimer laser having a wavelength of an ultraviolet range, especially about 193 nm, a plurality of absorption bands of oxygen $(O_2)$ are present in the band near this wavelength. When oxygen absorbs light, ozone $(O_3)$ is generated to enhance absorption of light, thereby greatly decreasing the transmittance. In addition, as described above, various types of products resulting from ozone attach to the surface of the optical element to decrease the efficiency of the optical system.

Therefore, in the optical path of the exposure optical system of the projection exposure apparatus, e.g., the ArF excimer laser, using far ultraviolet radiation as the light source, a method of suppressing the concentration of oxygen present in the optical path to a low level with a purge means using an inert gas, e.g., nitrogen, is employed.

SUMMARY OF THE INVENTION

Generally, in the semiconductor element manufacturing process, a large number of circuit patterns overlap the wafer and are exposed. To form a very fine circuit pattern, as described above, the overlapping precision must also be improved. Factors that cause an overlapping error include an image forming performance including the magnification, distortion, focus, and the like of the projection optical system. Factors that change the image forming performance include a change in the surrounding atmospheric pressure or temperature, a change in temperature of the projection optical system caused by exposure, and the like. These factors cause a change in index in the projection optical system and surface distortion of the optical element to change various types of aberrations, resulting in degradation in the image forming performance.

To correct the image forming performance, a method of controlling the position of a specific lens, a method of controlling the pressure of a specific portion of the projection optical system, and the like are available. Above all, when an excimer laser is used as the illumination light source, a method of correcting the image forming performance by changing the oscillation wavelength of the laser can be employed.

The correction method of changing the oscillation wavelength is more advantageous than other correction methods in that it does not require a precision drive mechanism or mechanical control mechanism, so that it can perform correction comparatively easily.

If, however, the ArF excimer laser is used as the illumination light source, since this laser has oxygen absorption bands near 193 nm, as described above, when the oscillation wavelength is changed, the absorbance midway along the optical path undesirably changes in accordance with the wavelengths. In the optical path of the exposure optical system, the concentration of oxygen present in the optical path is suppressed to a low level with the purge means employing an inert gas, e.g., nitrogen, as described above. However, when a drive operation and wafer exchange are frequently performed, like near the wafer surface, it is very difficult to decrease the oxygen concentration to completely zero, and a certain level of oxygen remains. Other than the place near the wafer, wherever oxygen remains, when the oscillation wavelength is changed, the absorbance also changes. As described with reference to FIG. 5, the sensor 11 can detect the light amount until the half mirror 5. In the optical path after the half mirror 5 and before the wafer 10, if the optical absorbance changes, it is impossible to perform integrated exposure amount control with high precision.

The present invention has been made in view of the problems of the prior art described above, and has as its object to enable integrated exposure amount control with high precision even when the wavelength of the light source is changed, so that a very fine circuit pattern can be transferred well.

In order to achieve the above object, according to the present invention, there is provided an exposure apparatus comprising an exposure optical system having a laser as a light source to irradiate a photosensitive substrate with light from the light source, exposure amount control means for controlling an exposure amount for the photosensitive substrate, wavelength changing means for changing an oscillation wavelength of the laser to a predetermined wavelength, and correction means for correcting a target exposure amount to irradiate the photosensitive substrate in accordance with the oscillation wavelength of the laser.

As a signal representing the oscillation wavelength of the laser, for example, an input to or output from the wavelength changing means can be used.

According to a first aspect of the present invention, in an exposure apparatus comprising an illumination optical system having a laser with an oscillation wavelength of 200 nm or less as a light source to irradiate a photosensitive substrate with light from the laser source, exposure amount control means for controlling an exposure amount for the photosensitive substrate, and wavelength changing means for changing an oscillation wavelength of the laser to a predetermined wavelength, the exposure amount control means corrects the exposure amount for the photosensitive substrate on the basis of an output from the wavelength changing means.

According to the second aspect of the present invention, when the exposure amount control means has an integrated exposure measurement unit for integrating a light intensity signal from the light source, correction means is provided to store and correct information concerning a relationship among an output from the integrated exposure measurement unit, an illuminance of the photosensitive substrate, and the oscillation wavelength, and the output value from the integrated exposure measurement unit is corrected on the basis of an output from the wavelength changing means.

According to the third aspect of the present invention, there is provided a projection exposure apparatus which comprises an illumination optical system having an ArF excimer laser with an oscillation wavelength of about 193 nm as a light source to illuminate a mask drawn with a predetermined pattern with light from the light source, and a projection optical system for reducing and projecting a pattern image on the mask onto the photosensitive substrate, and in which exposure amount control means is arranged to detect light branching midway along the optical path of the illumination optical system, wherein the exposure amount control means corrects the exposure amount for the photosensitive substrate on the basis of an output from the wavelength changing means.

According to the fourth aspect of the present invention, in the first aspect described above, a predetermined portion of an optical path, extending from an exit end of the light source to the photosensitive substrate, is divided into a plurality of blocks, and the apparatus has purge means for filling at least one optical element and the optical path accommodated in each of the blocks with an inert gas.

According to the present invention, even if the oscillation wavelength of the laser source is changed for the purpose of, e.g., correcting the image forming characteristics of the projection optical system, a detection error depending on the wavelength may not be present in the measured exposure amount. Therefore, exposure is always performed with an optimal exposure amount, and a very fine circuit pattern of a semiconductor element and the like can be formed well.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Figure 1:
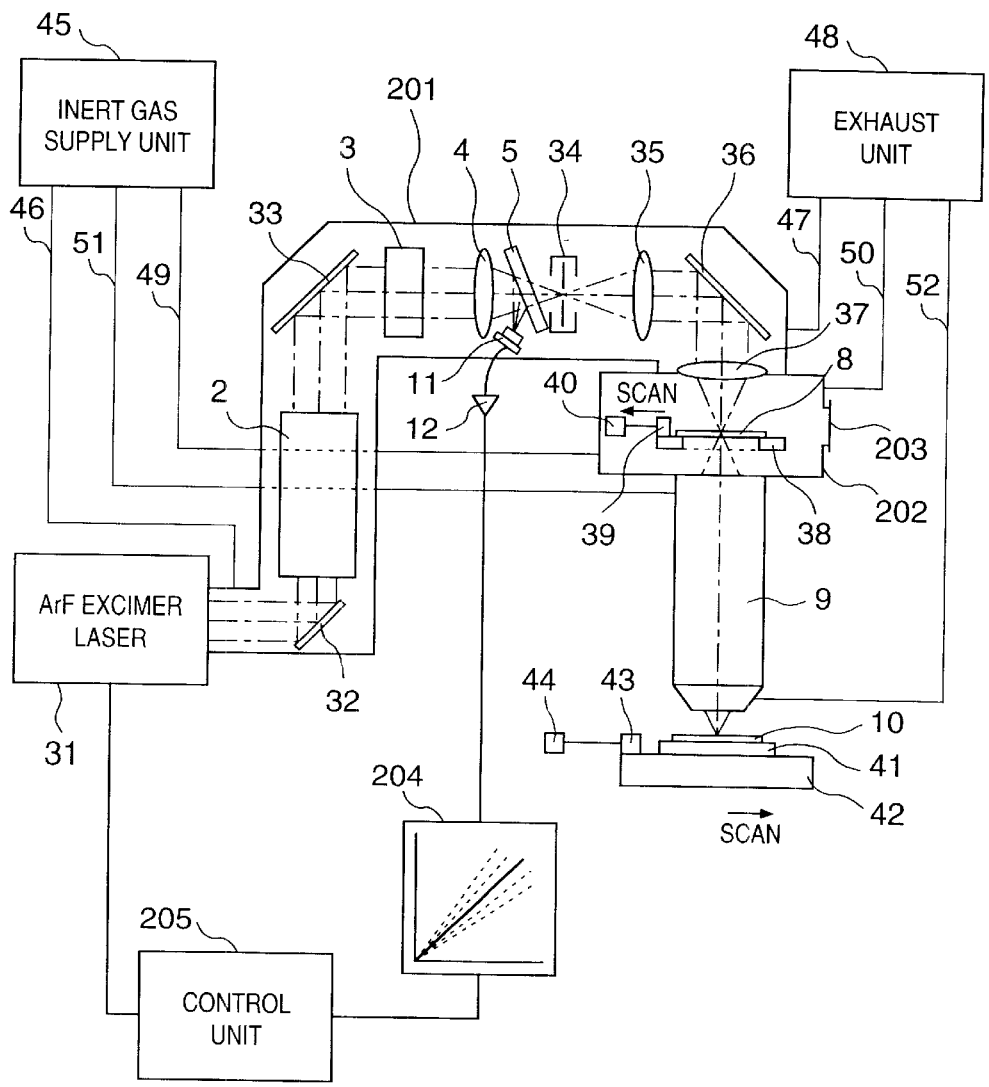
FIG. 1 is a view showing the schematic arrangement of a projection exposure apparatus according to an embodiment of the present invention.
Figure 2:
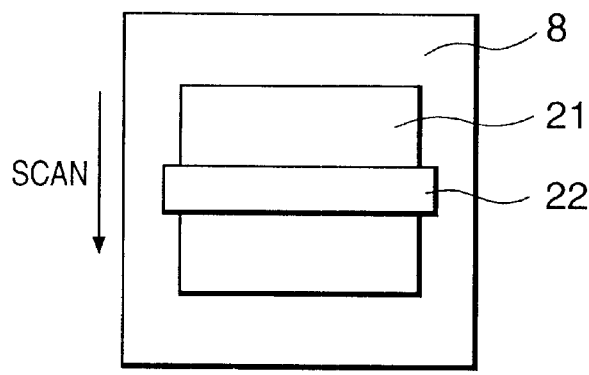
FIG. 2 is a detailed view of part of the apparatus shown in FIG. 1.
Figure 5:
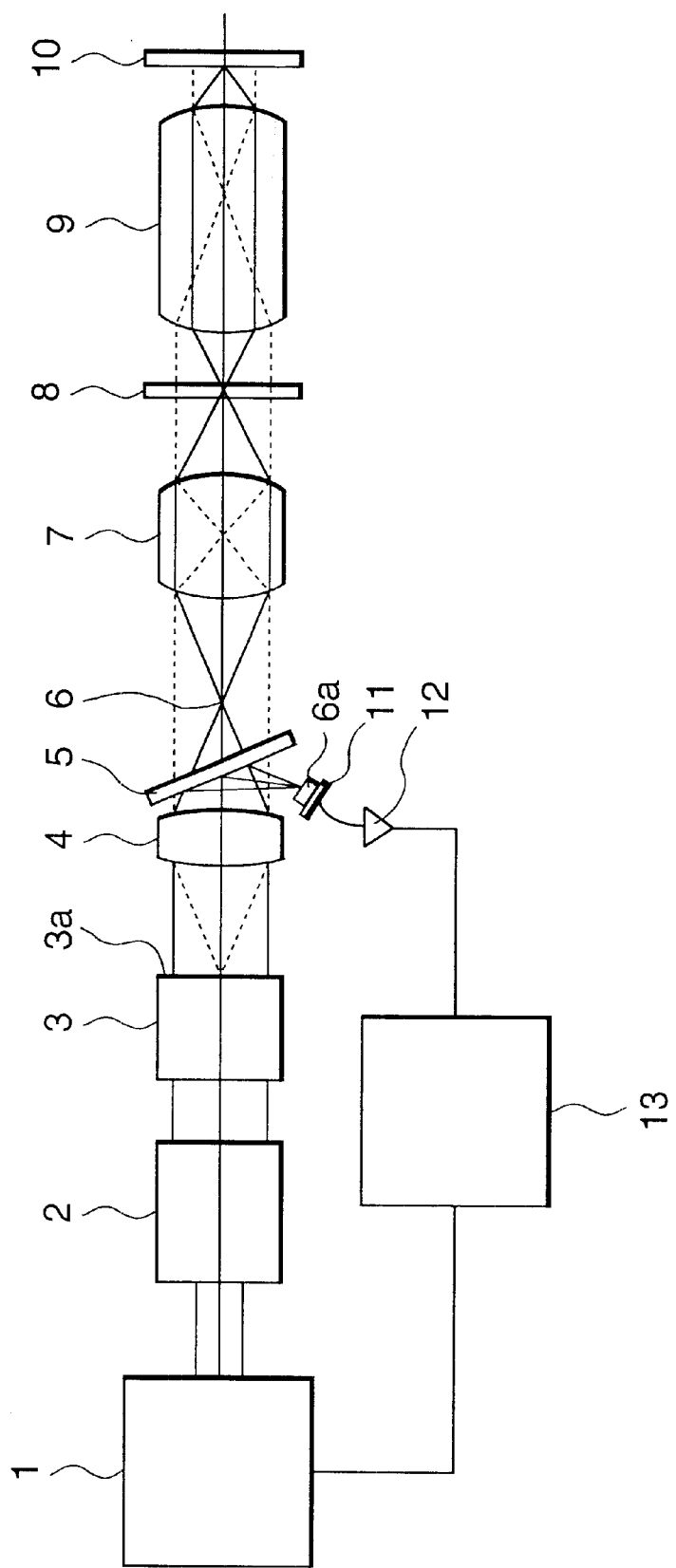
FIG. 5 is a conceptual view of an exposure apparatus.
Figure 6:
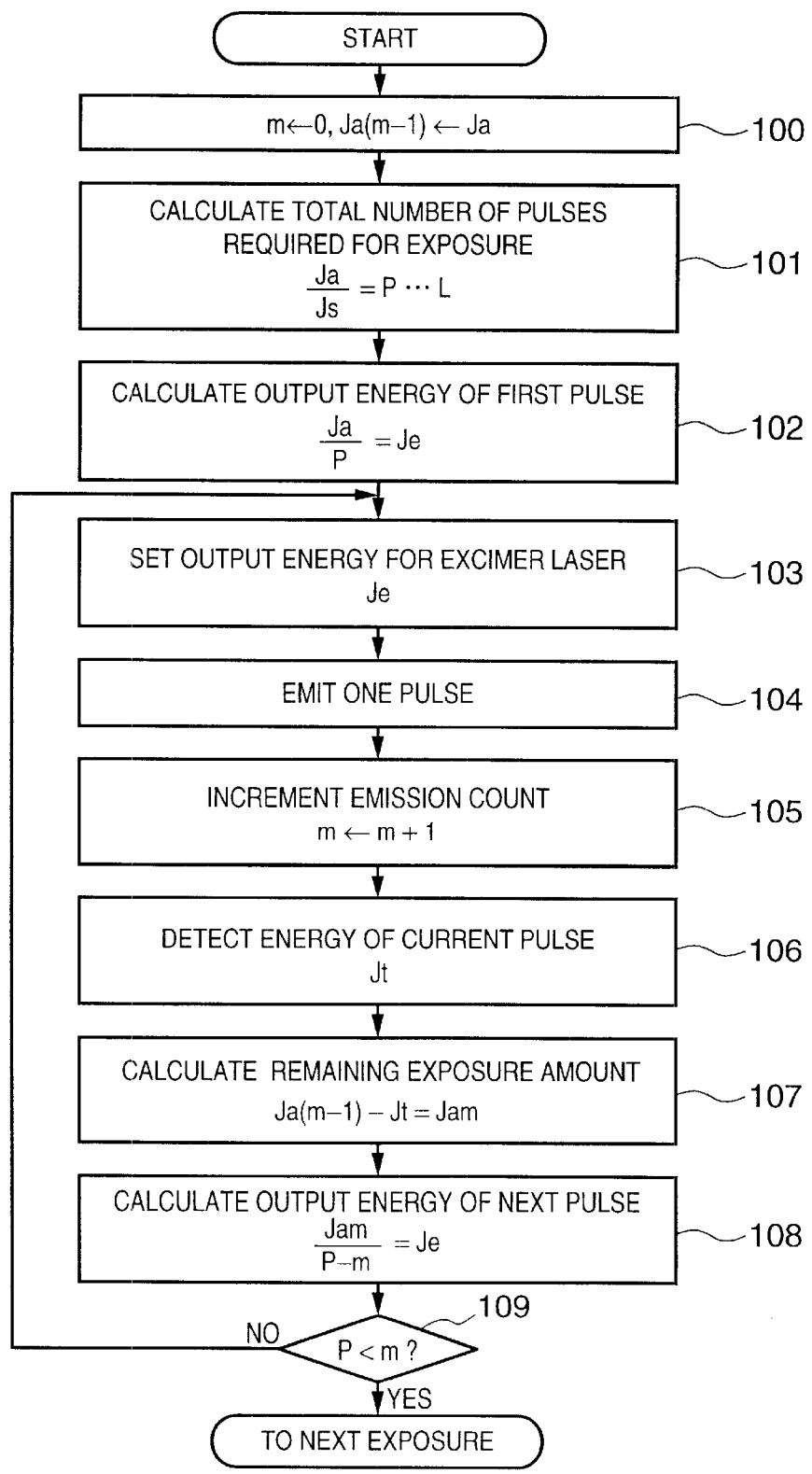
FIG. 6 is a flow chart of exposure amount control in the apparatus shown in FIG. 5.

FIG. 1 is a view showing the schematic arrangement of a step-and-scan type projection exposure apparatus according to an embodiment of the present invention. In FIG. 1, elements that are common with or correspond to those of FIG. 5 are denoted by the same reference numerals, and a detailed description thereof will thus be omitted. Referring to FIG. 1, an ArF excimer laser 31 has an oscillation wavelength near 193 nm and emits pulses. Reference numerals 32, 33, and 36 are mirrors, respectively. A blind 34 regulates the illumination range. Reference numerals 35 and 37 denote focusing lens front and rear groups, respectively. The arrangement of an illumination optical system 201 is the same as its counterpart described with reference to FIG. 5, except that part of a pattern 21 of a mask 8 is illuminated in a slit manner with a slit light beam 22, as shown in FIG. 2, to project, in reduction, part of the pattern 21 onto a wafer 10 with a projection optical system 9.

At this time, as indicated by an arrow shown in FIG. 1, while a mask 8 and the wafer 10 are scanned in opposite directions with respect to the projection optical system 9 and slit illumination 22 (FIG. 2) with a speed ratio equal to the ratio of reduction of the projection optical system 9, multi-pulse exposure with the pulse beam from the ArF excimer laser 31 is repeated, so that the pattern 21 on the entire surface of the mask 8 is transferred to a 1-chip region or a plurality of chip regions on the wafer 10.

A mask stage 38 holds the mask 8 and is driven by a drive system (not shown) to scan in the direction of an arrow. A half mirror 39 is fixed to the mask stage 38. A laser interferometer 40 detects the speed of the mask stage 38. A wafer chuck 41 holds the wafer 10. A wafer stage 42 holds the wafer chuck 41 and is driven by a drive system (not shown) to scan in the direction of the arrow. A half mirror 43 is fixed to the wafer stage 42. A laser interferometer 44 detects the speed of the wafer stage 42.

A mask chamber 202 has an openable opening/closing unit 203 attached to its exchange port for the mask 8, and is switched between the open state and sealed state by a drive system (not shown). A correction unit 204 corrects a signal from an amplifier 12 and will be described later in detail. A control unit 205 controls an integrated exposure and oscillation wavelength of the ArF excimer laser 31. An inert gas supply unit 45 supplies an inert gas to the illumination optical system 201, mask chamber 202, and projection optical system 9 through supply systems 46, 49, and 51, respectively.

The gas in the illumination optical system 201 is exhausted by an exhaust unit 48 through an exhaust system 47. Similarly, the gases in the mask chamber 202 and projection optical system 9 are exhausted by the exhaust unit 48 through exhaust systems 50 and 52, respectively.

As described above, it is known that, in the ArF excimer laser having a wavelength near 193 nm, a plurality of oxygen ($O_2$) absorption bands are present in the band near this wavelength. When the transmission efficiency of the illumination optical system and projection optical system is considered, a wavelength outside these absorption bands should naturally be used. As described above, however, in order to correct a change in image performance resulting from a change in various types of aberrations of the projection optical system, if the oscillation wavelength of the light source is changed by a predetermined amount, the absorbance in the optical path changes in accordance with the wavelength. In the embodiment shown in FIG. 1, for example, the optical path extending from the terminal end of the projection optical system to the wafer 10 is in the air atmosphere, and the absorbance of this portion changes accordingly. An inert gas purge is performed between a half mirror 5 and the terminal end of the projection optical system 9. If oxygen remains, light absorption as described above occurs.

Figure 3:
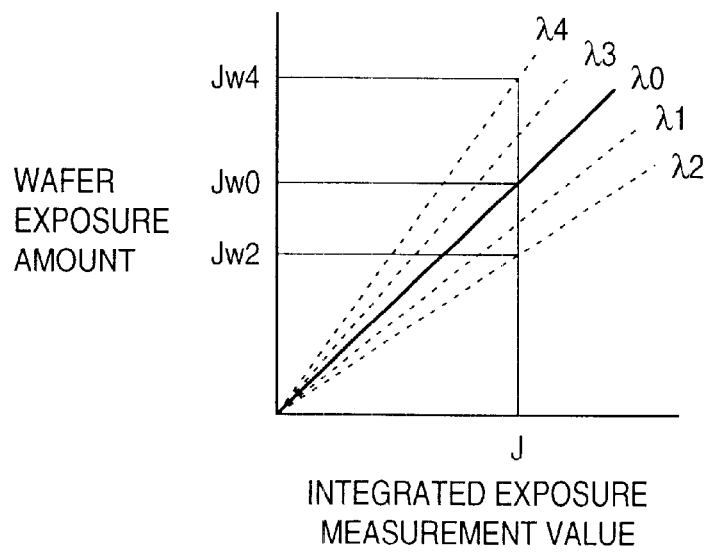
FIG. 3 is a graph showing information stored in the correction means of the apparatus shown in FIG. 1.

This will be described in more detail with reference to FIG. 3. Referring to FIG. 3, the axis of the abscissa represents an integrated exposure measurement value obtained by a sensor 11 in FIG. 1, and the axis of the ordinate represents the actual exposure amount of the wafer 10. When the designed wavelength is $\lambda_0$, the integrated exposure measurement value and the wafer exposure amount are in a linear relationship with each other. When the wavelength is changed to $\lambda_1, \lambda_2, \lambda_3, \lambda_4, \ldots$, the absorbance of the optical path after the half mirror 5 changes, and accordingly, the gradient of the straight line indicating the relationship between the integrated exposure measurement value and the wafer exposure amount changes from that of the straight line obtained when the wavelength is $\lambda_0$. Therefore, assuming that the integrated exposure amount measurement value is J shown in FIG. 3, the wafer exposure amount is Jw0 at the wavelength $\lambda_0$, the wafer exposure amount is Jw2 at the wavelength $\lambda_2$, and the wafer exposure amount is Jw4 at the wavelength $\lambda_4$. In other words, if the relationship among the wavelength, the integrated exposure amount, and the wafer exposure amount shown in FIG. 3 are known in advance, even if the wavelength is changed, a correct wafer exposure amount can be obtained by correcting the integrated exposure measurement value.

The correction unit 204 in FIG. 1 stores the relationship shown in FIG. 3 in advance to appropriately correct the signal from the amplifier 12 in accordance with the wavelength.

Figure 4:
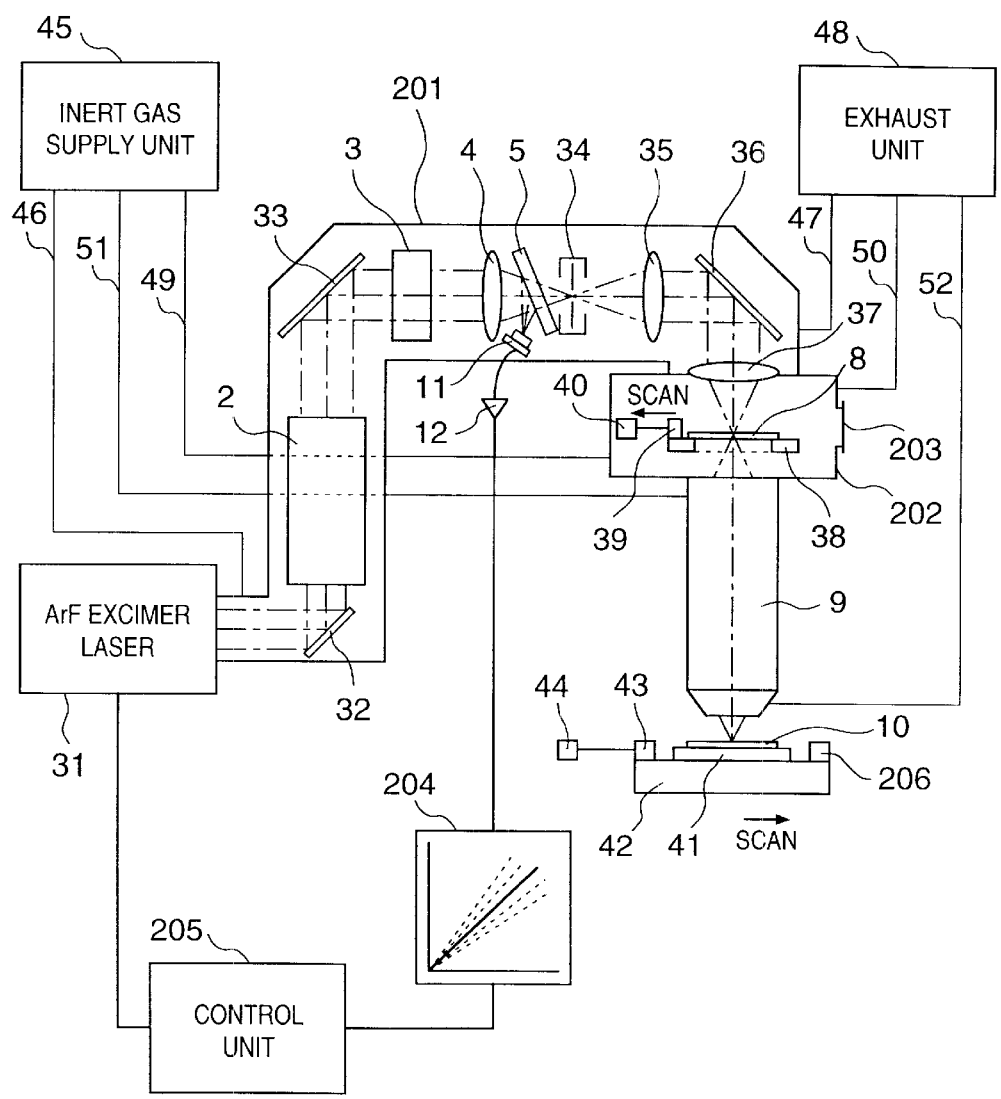
FIG. 4 is a view showing the schematic arrangement of a projection exposure apparatus according to another embodiment of the present invention.

FIG. 4 shows an embodiment in which an illumination meter placed on a wafer stage is used as a means for obtaining in advance the relationship among the wavelength, the integrated exposure measurement value, and the wafer exposure amount described in the first embodiment. Elements that are identical to those of FIG. 1 are denoted by the same reference numerals, and a detailed description thereof will be omitted. Referring to FIG. 4, an illumination meter 206 is placed on a wafer stage 42 to measure the illuminance of a predetermined portion within an angle of view where a wafer 10 is exposed. During measurement, the wafer stage 42 is moved to move the illumination meter 206 to a position corresponding to the angle of view of exposure of the wafer 10. In the apparatus having this arrangement, correction can be performed in accordance with, e.g., the following procedure.

While an ArF excimer laser 31 is caused to oscillate a designed wavelength, measurement is performed with the illumination meter 206 and a sensor 11. The wavelength is changed by a predetermined amount, and measurement is performed with the illumination meter 206 and sensor 11. In this manner, measurement with the illumination meter 206 and sensor 11 is performed while changing the wavelength by a number of times within the wavelength change range. The relationship among the wavelength, the integrated exposure measurement value, and the wafer illuminance (measurement value measured by the illumination meter 206) is stored in a correction unit 204. When the wafer is to be actually exposed, signals from the sensor 11 and an amplifier 12 are corrected on the basis of this data, and integrated exposure control is performed by a control unit 205.

As described above, according to the above embodiment, in a projection exposure apparatus using, as a light source, a laser, e.g., an ArF excimer laser, having an oscillation wavelength of 200 nm or less, even if the wavelength of the light source is changed in order to correct the image forming characteristics of the projection optical system, integrated exposure control can be performed with high precision, and a very fine circuit pattern can be projected well.

The two embodiments are described above. The present invention is not limited to an apparatus employing an inert gas purge, as shown in FIGS. 1 and 4, but can exhibit its effect even if the inert gas purge chamber is divided differently or an inert gas purge is performed at a different portion on the optical path.

In the second embodiment, an illumination meter placed on a wafer stage is used as a means for measuring the illuminance of the wafer surface. However, the present invention is not limited to this, but can employ any other measurement means as far as the wavelength from the light source, the integrated exposure measurement value, and the wafer illuminance are known in advance. In short, the characteristic feature of the above embodiments resides in that the above relationship is stored, and the integrated exposure measurement value is corrected on the basis of this relationship in accordance with the wavelength, thereby performing integrated exposure control. Accordingly, the exposure apparatus may be of either one of the step-and-repeat type and the step-and-scan type described so far.

An embodiment of a device manufacturing method utilizing the exposure apparatus or exposure method described above will be described.

Figure 7:
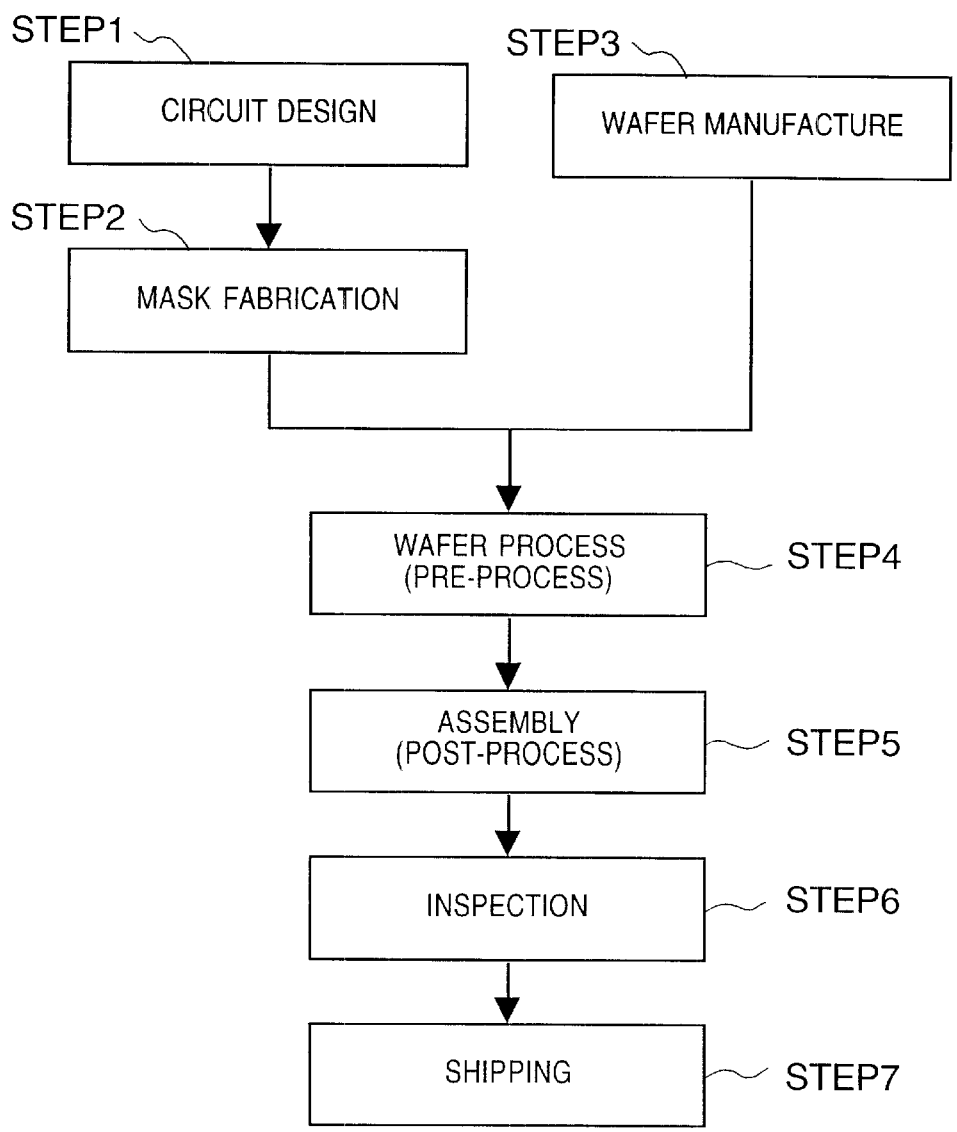
FIG. 7 is a flow chart showing the flow of the manufacture of a microdevice.

FIG. 7 shows the flow of the manufacture of a microdevice (e.g., a semiconductor chip such as an IC or LSI, a liquid crystal panel, a CCD, a thin film magnetic head, a micromachine, or the like). In step 1 (circuit design), pattern design of the device is performed. In step 2 (mask fabrication), a mask formed with the designed pattern is fabricated. In step 3 (wafer manufacture), a wafer is manufactured by using a material such as silicon or glass. Step 4 (wafer process) is called a pre-process wherein the mask and wafer prepared above are used to form an actual circuit on the wafer in accordance with lithography techniques. Step 5 (assembly) is called a post-process wherein the wafer fabricated in step 4 is formed into semiconductor chips. Step 5 includes an assembly step (dicing, bonding), a packaging step (chip encapsulation), and the like. In step 6 (inspection), inspection such as an operation confirmation test, a durability test, and the like of the semiconductor device fabricated in step 5 is performed. The semiconductor device is completed through these steps, and is shipped (step 7).

Figure 8:
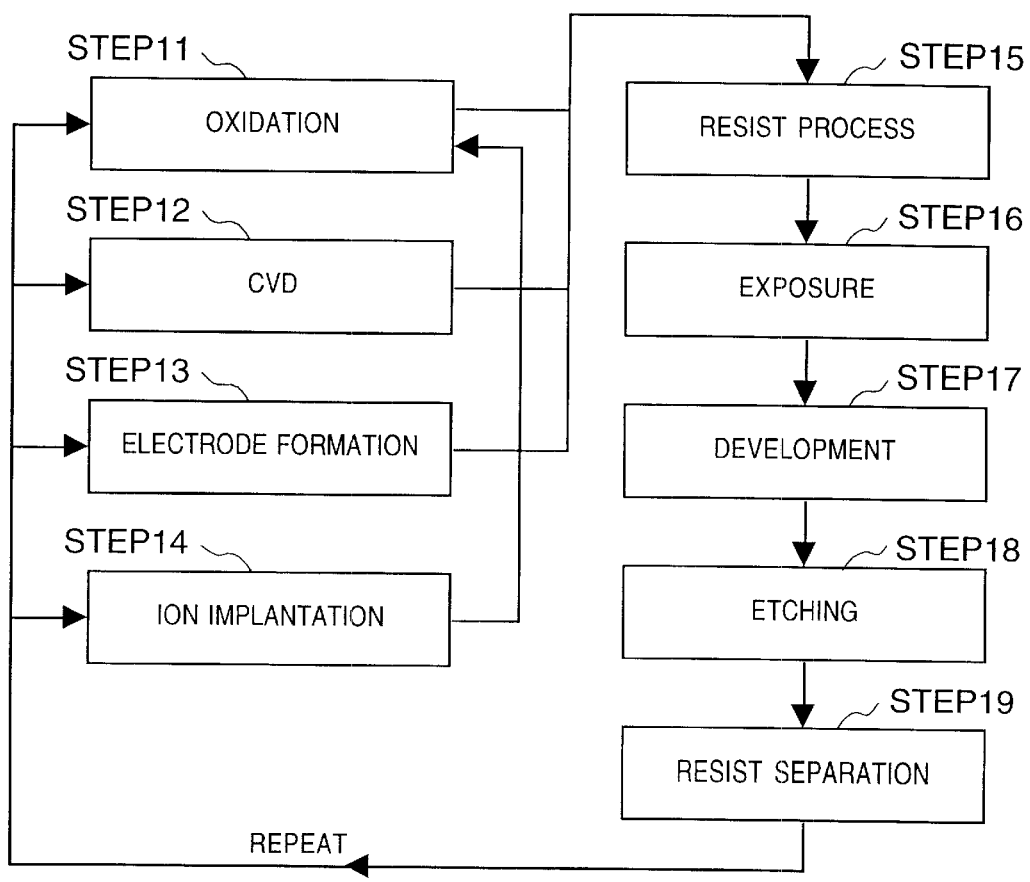
FIG. 8 is a flow chart showing the flow of the wafer process of FIG. 7 in detail.

FIG. 8 shows a detailed flow of the above wafer process. In step 11 (oxidation), the surface of the wafer is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist process), a photosensitive agent is applied to the wafer. In step 16 (exposure), the circuit pattern of the mask is printed onto the wafer and exposed by the exposure apparatus having the exposure amount control unit described above. In step 17 (development), the exposed wafer is developed. In step 18 (etching), a portion other than the developed resist image is removed. In step 19 (resist separation), the resist which has become unnecessary after etching is removed. These steps are repeatedly performed to form circuit patterns on the wafer in a multiple manner.

When the manufacturing method of this embodiment is used, a high-integration device, which is conventionally difficult to manufacture, can be manufactured at a low cost.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus comprising:

a laser for emitting light, said laser having a variable wavelength;

an optical system for exposing a photosensitive substrate with the light from said laser; and a control system for controlling an exposure amount for the photosensitive substrate, said control system comprising (i) a photodetector for detecting a portion of the light, (ii) an integrating portion for integrating an output from the photodetector to form an integrated signal, and (iii) a correcting portion for correcting the integrated signal in accordance with a change in wavelength of the light emitted by said laser.

2. The apparatus according to claim 1, wherein (i) said laser emits pulses, (ii) the photodetector integrates an intensity of the light from said laser, (iii) the control system generates a control signal so as to control a light amount per pulse of said laser and an emission pulse count on a basis of the amount of light detected by the photodetector, and (iv) said correcting portion corrects the control signal on a basis of information concerning a relationship amount the output from the photodetector, an illuminance of the photosensitive substrate, and information on the oscillation wavelength of said laser.

3. The apparatus according to claim 2, wherein said optical system comprises (i) an illumination optical system for illuminating a mask drawn with a pattern with light from said laser, and (ii) a projection optical system for reducing and projecting the pattern on the mask onto the photosensitive substrate, and the photodetector is arranged to detect light branching midway along an optical path of said illumination optical system.

4. The apparatus according to claim 1, wherein said correcting portion corrects the integrated signal in accordance with an oscillation wavelength of said laser.

5. The apparatus according to claim 1, wherein an oscillation wavelength of said laser is not more than 200 nm.

6. The apparatus according to claim 5, wherein said laser is an ArF excimer laser having an oscillation wavelength near 193 nm.

7. The apparatus according to claim 1, wherein a predetermined portion of an optical path, extending from an exit end of said laser to the photosensitive substrate, is divided into a plurality of blocks, and said apparatus further comprises purge means for filling at least one optical element and the optical path accommodated in each of the plurality of blocks with an inert gas.

8. A device manufacturing method for manufacturing a device, said method comprising:

emitting light from a laser, the laser having a variable wavelength;

exposing, with an optical system, a photosensitive substrate with the light from the laser to manufacture a device; and controlling, with a control system, an exposure amount for the photosensitive substrate, said controlling step comprising (i) detecting, with a photodetector, a portion of the light, (ii) integrating, with an integrating portion, an output from the photodetector to form an integrated signal, and (iii) correcting, with a correcting portion, the integrated signal in accordance with a change in wavelength of the light emitted by the laser.

9. An exposure method comprising:

emitting light from a laser, the laser having a variable wavelength;

exposing, with an optical system, a photosensitive substrate with the light from the laser to manufacture a device; and controlling, with a control system, an exposure amount for the photosensitive substrate, said controlling step comprising (i) detecting, with a photodetector, a portion of the light, (ii) integrating, with an integrating portion, an output from the photodetector to form an integrated signal, and (iii) correcting, with a correcting portion, the integrated signal in accordance with a change in wavelength of the light emitted by the laser.

* * * * *

UNITED STATES PATENT AND TRADEMARK OFFICE
CERTIFICATE OF CORRECTION

PATENT NO. : 6,493,066 B1
DATED : December 10, 2002
INVENTOR(S) : Yoshinori Miwa It is certified that error appears in the above-identified patent and that said Letters Patent is hereby corrected as shown below:

<u>Title page</u>,
Item [56], FOREIGN PATENT DOCUMENTS, "EP 0 866 300 A2  6/1998" should read -- EP 0 886 300 A2  6/1998 --.
"EP 0 886 300  6/1998" should be deleted.

<u>Column 9</u>,
Line 27, "amount" should read -- among --.

Signed and Sealed this

Twenty-sixth Day of August, 2003

JAMES E. ROGAN
*Director of the United States Patent and Trademark Office*